US012665162B2

(12) United States Patent
Sundermeyer et al.

(10) Patent No.: US 12,665,162 B2
(45) Date of Patent: Jun. 23, 2026

(54) DUAL-USE READ-OUT CIRCUITRY IN CHARGED PARTICLE DETECTION SYSTEM

(71) Applicant: ASML Netherlands B.V., Veldhoven (NL)

(72) Inventors: Jan Louis Sundermeyer, Nuremberg (DE); Leonhard Martin Klein, Nuremberg (DE); Matthias Oberst, Nuremberg (DE); Harald Gert Helmut Neubauer, Erlangen (DE)

(73) Assignee: ASML Netherlands B.V., Veldhoven (NL)

( * ) Notice: Subject to any disclaimer, the term of this patent is extended or adjusted under 35 U.S.C. 154(b) by 439 days.

(21) Appl. No.: 18/257,736

(22) PCT Filed: Dec. 13, 2021

(86) PCT No.: PCT/EP2021/085389
§ 371 (c)(1),
(2) Date: Jun. 15, 2023

(87) PCT Pub. No.: WO2022/128860
PCT Pub. Date: Jun. 23, 2022

(65) Prior Publication Data
US 2024/0055221 A1     Feb. 15, 2024

Related U.S. Application Data

(60) Provisional application No. 63/127,628, filed on Dec. 18, 2020.

(51) Int. Cl.
*H01J 37/244*          (2006.01)
(52) U.S. Cl.
CPC ... *H01J 37/244* (2013.01); *H01J 2237/24495* (2013.01)

(58) Field of Classification Search
CPC ..................... H01J 37/244; H01J 2237/24495
See application file for complete search history.

(56) References Cited

U.S. PATENT DOCUMENTS 3,901,814 A * 8/1975 Davis .................... H01J 37/304
                                                    219/121.29
4,117,453 A * 9/1978 Hodgson .............. B60Q 1/1423
                                                    315/83
(Continued)

FOREIGN PATENT DOCUMENTS

JP          S61501867 A  *  8/1986
JP          H06-213755 A     8/1994
(Continued)

OTHER PUBLICATIONS

International Search Report issued in related Foreign Application No. PCT/EP2021/085389; mailed Mar. 17, 2022 (2 pgs.).
(Continued)

*Primary Examiner* — David A Vanore
(74) *Attorney, Agent, or Firm* — Finnegan, Henderson, Farabow, Garrett & Dunner LLP

(57) ABSTRACT

An improved readout circuit for a charged particle detector and a method for operating the readout circuit are disclosed. An improved circuit comprises an amplifier configured to receive a signal representing an output of a sensor layer and comprising a first input terminal and an output terminal, a capacitor connected between the first input terminal and the output terminal, and a resistor connected in parallel with the capacitor between the first input terminal and the output terminal. The circuit can be configured to operate in a first mode and a second mode. The capacitor can be adjustable using a capacitance value of the capacitor to enable control of a gain of the circuit operating in the first mode and control of a bandwidth of the circuit operating in the second mode.

15 Claims, 9 Drawing Sheets

(56) References Cited

U.S. PATENT DOCUMENTS

| | | | | |
|---|---|---|---|---|
| 4,437,146 A * | 3/1984 | Carpenter | ............. | H02M 3/156 |
| | | | | 363/101 |
| 4,494,551 A * | 1/1985 | Little, III | ................ | H03F 1/304 |
| | | | | 600/509 |
| 4,574,249 A * | 3/1986 | Williams | ........... | H04B 10/6931 |
| | | | | 330/59 |
| 6,232,834 B1 * | 5/2001 | Zheng | ................ | G01R 31/2837 |
| | | | | 330/109 |
| 6,593,765 B1 * | 7/2003 | Ishida | ............. | G01R 31/31917 |
| | | | | 324/762.03 |
| 8,785,878 B2 * | 7/2014 | Arita | .................. | H01J 37/3174 |
| | | | | 250/397 |
| 9,069,365 B2 * | 6/2015 | Brown | ...................... | G05F 3/08 |
| 2004/0026621 A1 * | 2/2004 | Hayn | ................... | H01J 37/244 |
| | | | | 250/311 |
| 2009/0082691 A1 * | 3/2009 | Denison | ................ | A61B 5/374 |
| | | | | 600/544 |
| 2013/0143161 A1 * | 6/2013 | Arita | .................. | H01J 37/3177 |
| | | | | 250/397 |
| 2014/0253237 A1 * | 9/2014 | Lyden | ................ | H03F 3/45183 |
| | | | | 330/260 |
| 2017/0277042 A1 * | 9/2017 | Akkermans | .......... | G03F 7/7085 |
| 2019/0214221 A1 * | 7/2019 | Ishii | ...................... | H01J 37/244 |
| 2023/0005706 A1 * | 1/2023 | Mangnus | ............. | H01J 37/244 |
| 2023/0015584 A1 * | 1/2023 | Jurek | ...................... | H01J 43/22 |
| 2023/0207256 A1 * | 6/2023 | Subhi Mohammed Al Disi | ......... | |
| | | | | H01J 37/244 |
| | | | | 250/397 |
| 2023/0238211 A1 * | 7/2023 | Wieland | .............. | H01J 37/3177 |
| | | | | 250/396 R |
| 2023/0335372 A1 * | 10/2023 | Wang | ................... | H04N 25/773 |
| 2024/0055221 A1 * | 2/2024 | Sundermeyer | ........ | H01J 37/244 |

FOREIGN PATENT DOCUMENTS

| | | | | | |
|---|---|---|---|---|---|
| KR | | 102777031 B1 * | 3/2025 | ........ | H01J 37/32541 |
| WO | WO-2025038926 A1 * | | 2/2025 | ........ | H01J 37/32935 |

OTHER PUBLICATIONS

J. Mountford et al., "Development of a switched integrator amplifier for high-accuracy optical measurements", Applied Optics, Optical Society of America, Washington, DC, US, vol. 47, No. 31, Nov. 1, 2008 (Nov. 1, 2008), pp. 5821-5828, XP001519363, ISSN: 0003-6935, DOI: 10.1364/AO.47.005821 figures 2,3.

* cited by examiner

100

300A

300B

300C

400

600

DUAL-USE READ-OUT CIRCUITRY IN CHARGED PARTICLE DETECTION SYSTEM

CROSS-REFERENCE TO RELATED APPLICATIONS

This application is a national stage filing under 35 U.S.C. § 371 of International Application No. PCT/EP2021/085389, filed Dec. 13, 2021, and published as WO 2022/128860 A1, which claims priority of U.S. application 63/127,628 which was filed on Dec. 18, 2020 and both of which are incorporated herein in their entirety by reference.

FIELD

The description herein relates to detectors that may be useful in the field of charged particle beam systems, and more particularly, to systems and methods that may be applicable to charged particle detection.

BACKGROUND

Detectors may be used for sensing physically observable phenomena. For example, charged particle beam tools, such as electron microscopes, may comprise detectors that receive charged particles projected from a sample and that output detection signals. Detection signals may be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Inspection systems may be provided for this purpose. For example, a microscopy system using a scanning electron microscope (SEM) may use an electron beam to scan across a sample and derive information from backscattered or secondary electrons generated from the sample.

A detector of the SEM may be provided with an array of sensing elements that generate signals in response to incoming charged particles, which enables detecting a beam pattern or a beam position projected on a detection surface. After the beam pattern or the beam position is detected, a beam intensity for the detected beam may be measured based on a sum of signals from sensing elements onto the detected beam is projected. A detector may be provided with a readout IC accommodating circuits for detecting a beam intensity as well as circuits for reading out signals from each sensing element. For higher efficiency and faster speed, a SEM system may use multiple primary beams for inspection and, accordingly, a detector may receive corresponding multiple secondary beams simultaneously and thus, more circuits for detecting multiple beam intensities need to be integrated in the readout IC of the detector. However, there are limits to a detector's capability for accommodating circuits due to its limited area on the readout IC and improvements in detection systems are thus desired.

SUMMARY

The embodiments provided herein disclose a particle beam inspection apparatus, and more particularly, an inspection apparatus using a plurality of charged particle beams.

In some embodiments, a circuit for a charged particle detector is provided. The circuit comprises an amplifier configured to receive a signal representing an output of a sensor layer and comprising a first input terminal and an output terminal, a capacitor connected between the first input terminal and the output terminal, and a resistor connected in parallel with the capacitor between the first input terminal and the output terminal. The circuit can be configured to operate in a first mode and a second mode. The capacitor can be adjustable using a capacitance value of the capacitor to enable control of a gain of the circuit operating in the first mode and control of a bandwidth of the circuit operating in the second mode.

In some embodiments, a charged particle detector is provided. The charged particle detector comprises a sensor layer comprising a plurality of sensing elements and a circuit. The circuit comprises an amplifier configured to receive a signal representing an output of the sensor layer and comprising a first input terminal and an output terminal, a capacitor connected between the first input terminal and the output terminal, and a resistor connected in parallel with the capacitor between the first input terminal and the output terminal. The circuit can be configured to operate in a first mode and a second mode. The capacitor can be adjustable using a capacitance value of the capacitor to enable control of a gain of the circuit operating in the first mode and control of a bandwidth of the circuit operating in the second mode.

In some embodiments, a computer-implemented method for operating a circuit for a charged particle detector is provided. The method comprises acquiring an operation mode of the circuit, the operation mode comprising a first mode and the second mode. The circuit comprises: an amplifier configured to receive a signal representing an output of a sensor layer and having a first input terminal and an output terminal and a capacitor connected between the first input terminal and the output terminal. The method further comprises determining a set of one or more sensing elements in the sensor layer to be connected to the circuit according to the acquired operation mode, wherein one sensing element is coupled to the circuit in the first mode and a set of multiple sensing elements are coupled to the circuit in the second mode; determining, according to the acquired operation mode, a capacitance value of the capacitor based on the determined set of one or more sensing elements; and causing the circuit to operate in the acquired operation mode based on the determined capacitance value of the capacitor. The capacitance value of the capacitor is determined to obtain a target gain of the circuit in the first mode and to obtain a target bandwidth of the circuit in the second mode.

In some embodiments, a non-transitory computer readable medium that stores a set of instructions that are executable by at least one processor of a system to cause the system to perform a method for operating a circuit for a charged particle detector is provided. The method comprises acquiring an operation mode of the circuit, the operation mode comprising a first mode and the second mode. The circuit comprises an amplifier configured to receive a signal representing an output of a sensor layer and having a first input terminal and an output terminal and a capacitor connected between the first input terminal and the output terminal. The method further comprises determining a set of one or more sensing elements in the sensor layer to be connected to the circuit according to the acquired operation mode, wherein one sensing element is coupled to the circuit in the first mode and a set of multiple sensing elements are coupled to the circuit in the second mode, determining, according to the acquired operation mode, a capacitance value of the capacitor based on the determined set of one or more sensing elements, and causing the circuit to operate in the acquired operation mode based on the determined capacitance value of the capacitor. The capacitance value of the capacitor is determined to obtain a target gain of the circuit in the first mode and to obtain a target bandwidth of the circuit in the second mode.

In some embodiments, a circuit for a charged particle detector is provided. The circuit comprises a first channel comprising: a first amplifier configured to receive a first signal representing a first output of a first set of sensing elements and comprising a first input terminal and a first output terminal; a first capacitor connected between the first input terminal and the first output terminal; and a first resistor connected in parallel with the first capacitor between the first input terminal and the first output terminal, and a second channel comprising: a second amplifier configured to receive a second signal representing a second output of a second set of sensing elements and comprising a second input terminal and a second output terminal; a second capacitor connected between the second input terminal and the second output terminal; and a second resistor connected in parallel with the second capacitor between the second input terminal and the second output terminal. The first channel and the second channel can be configured to be controlled to have an equal gain by adjusting a capacitance value of either of the first capacitor or the second capacitor.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1:
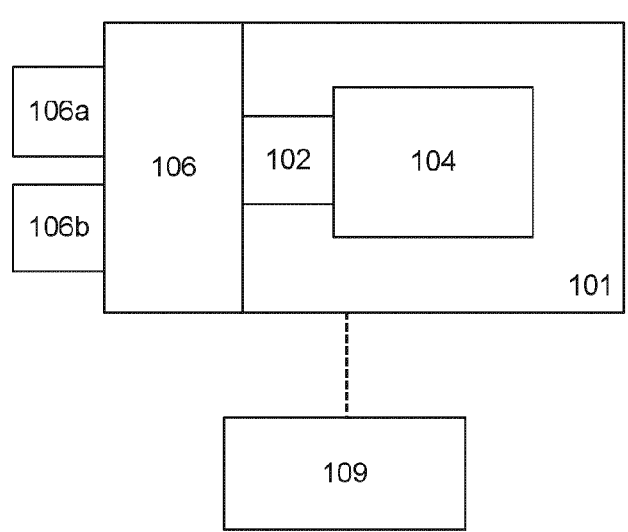
FIG. 1 is a schematic diagram illustrating an exemplary charged-particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing charged-particle beams (e.g., electron beams), the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of semiconductor material called a substrate. The semiconductor material may include, for example, silicon, gallium arsenide, indium phosphide, or silicon germanium, or the like. Many circuits may be formed together on the same piece of silicon and are called integrated circuits or ICs. The size of these circuits has decreased dramatically so that many more of them can be fit on the substrate. For example, an IC chip in a smartphone can be as small as a thumbnail and yet may include over 2 billion transistors, the size of each transistor being less than $\frac{1}{1000}$th the size of a human hair.

Making these ICs with extremely small structures or components is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning charged-particle microscope ("SCPM"). For example, an SCPM may be a scanning electron microscope (SEM). A SCPM can be used to image these extremely small structures, in effect, taking a "picture" of the structures of the wafer. The image can be used to determine if the structure was formed properly in the proper location. If the structure is defective, then the process can be adjusted, so the defect is less likely to recur.

The working principle of a SEM is similar to a camera. A camera takes a picture by receiving and recording intensity of light reflected or emitted from people or objects. A SEM takes a "picture" by receiving and recording energies or quantities of electrons reflected or emitted from the structures of the wafer. Before taking such a "picture," an electron beam may be projected onto the structures, and when the electrons are reflected or emitted ("exiting") from the structures (e.g., from the wafer surface, from the structures underneath the wafer surface, or both), a detector of the SEM may receive and record the energies or quantities of those electrons to generate an inspection image. To take such a "picture," the electron beam may scan through the wafer (e.g., in a line-by-line or zig-zag manner), and the detector may receive exiting electrons coming from a region under electron-beam projection (referred to as a "beam spot"). The detector may receive and record exiting electrons from each beam spot one at a time and join the information recorded for all the beam spots to generate the inspection image. Some SEMs use a single electron beam (referred to as a "single-beam SEM") to take a single "picture" to generate the inspection image, while some SEMs use multiple electron beams (referred to as a "multi-beam SEM") to take multiple "sub-pictures" of the wafer in parallel and stitch them together to generate the inspection image. By using multiple electron beams, the SEM may provide more electron beams onto the structures for obtaining these multiple "sub-pictures," resulting in more electrons exiting from the structures. Accordingly, the detector may receive more exiting electrons simultaneously and generate inspection images of the structures of the wafer with higher efficiency and faster speed.

Exiting electrons received by the detector of the SEM may cause the detector to generate electrical signals (e.g., current signals or voltage signals) commensurate to the energy of the exiting electrons and the intensity of the electron beam. For example, the amplitudes of the electrical signals may be commensurate to the charges of the received exiting electrons. The detector may output the electrical signals to an image processor, and the image processor may process the electrical signals to form the image of structures of the wafer.

A detector of the SEM may be provided with an array of sensing elements that generate signals in response to incoming charged particles, which enables detecting a beam pattern or a beam position projected on a detection surface. After the beam pattern or the beam position is detected, a beam intensity for the detected beam may be measured based on a sum of signals from sensing elements onto the detected beam is projected. A detector may be provided with a readout IC accommodating circuits for detecting a beam intensity as well as circuits for reading out signals from each sensing element. For higher efficiency and faster speed, a SEM system may use multiple primary beams for inspection and, accordingly, a detector may receive corresponding multiple secondary beams simultaneously and thus, more circuits for detecting multiple beam intensities need to be integrated in the readout IC of the detector. However, there are limits to a detector's capability for accommodating circuits due to its limited area on the readout IC and improvements in detection systems are thus desired.

Further, existing detection systems may suffer from non-uniform bandwidths among multiple circuits for detecting beam intensities of multiple beams because the number of sensing elements or sensing elements connected to each of multiple circuits for detecting beam intensities may be different. However, when multiple circuits for detecting beam intensities have different system bandwidths, an image reconstruction quality of a wafer may be deteriorated.

Embodiments of the disclosure may provide a readout circuit that can be used in a beam detection mode and in a beam intensity detection mode in a charged particle beam detector. Embodiments of the disclosure may also provide systems and methods that enable to obtain a uniform bandwidth over multiple readout channels in a detector regardless of positions of beams on a sensor surface and the number of sensing elements connected to the multiple readout channels.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing detection systems and detection methods in systems utilizing electron beams ("e-beams"). However, the disclosure is not so limited. Other types of charged particle beams may be similarly applied. Furthermore, systems and methods for detection may be used in other imaging systems, such as optical imaging, photon detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, a beam tool 104, and an equipment front end module (EFEM) 106. Beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by beam tool 104. Beam tool 104 may be a single-beam system or a multi-beam system.

A controller 109 is electronically connected to beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes and data may include an operating system (OS) and one or more application programs (or "apps") for specific tasks. The memory may also be a virtual memory that includes one or more memories distributed across multiple machines or devices coupled via a network.

Figure 2:
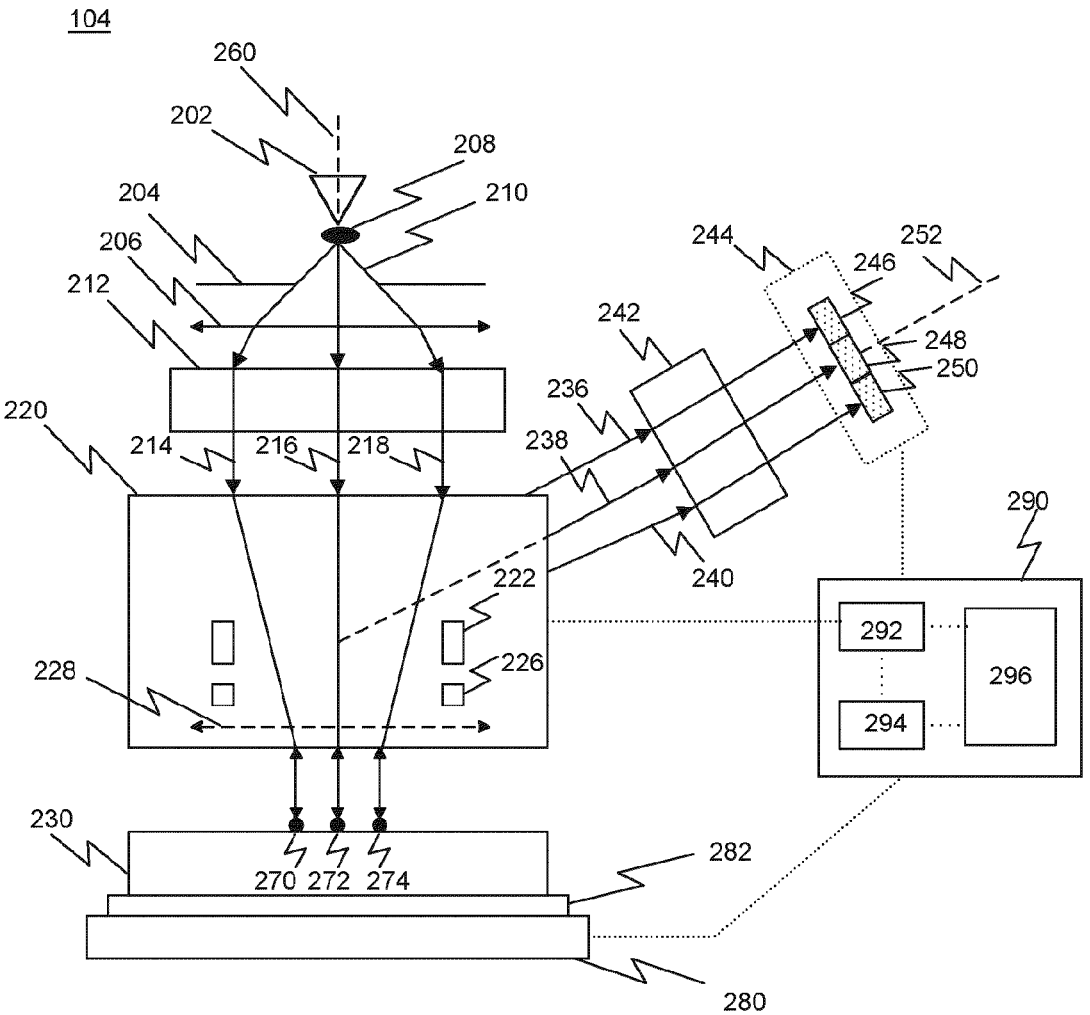
FIG. 2 is a schematic diagram illustrating an exemplary multi-beam beam tool, consistent with embodiments of the present disclosure that can be a part of the exemplary charged-particle beam inspection system of FIG. 1.

FIG. 2 illustrates a schematic diagram of an exemplary multi-beam beam tool 104 (also referred to herein as apparatus 104) and an image processing system 290 that may be configured for use in EBI system 100 (FIG. 1), consistent with embodiments of the present disclosure.

Beam tool 104 comprises a charged-particle source 202, a gun aperture 204, a condenser lens 206, a primary charged-particle beam 210 emitted from charged-particle source 202, a source conversion unit 212, a plurality of beamlets 214, 216, and 218 of primary charged-particle beam 210, a primary projection optical system 220, a motorized wafer stage 280, a wafer holder 282, multiple secondary charged-particle beams 236, 238, and 240, a secondary optical system 242, and a charged-particle detection device 244. Primary projection optical system 220 can comprise a beam separator 222, a deflection scanning unit 226, and an objective lens 228. Charged-particle detection device 244 can comprise detection sub-regions 246, 248, and 250.

Charged-particle source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and charged-particle detection device 244 can be aligned with a secondary optical axis 252 of apparatus 104.

Charged-particle source 202 can emit one or more charged particles, such as electrons, protons, ions, muons, or any other particle carrying electric charges. In some embodiments, charged-particle source 202 may be an electron source. For example, charged-particle source 202 may include a cathode, an extractor, or an anode, wherein primary electrons can be emitted from the cathode and extracted or accelerated to form primary charged-particle beam 210 (in this case, a primary electron beam) with a crossover (virtual or real) 208. For ease of explanation without causing ambiguity, electrons are used as examples in some of the descriptions herein. However, it should be noted that any charged particle may be used in any embodiment of this disclosure, not limited to electrons. Primary charged-particle beam 210 can be visualized as being emitted from crossover 208. Gun aperture 204 can block off peripheral charged particles of primary charged-particle beam 210 to reduce Coulomb effect. The Coulomb effect may cause an increase in size of probe spots.

Source conversion unit 212 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 208 with a plurality of beamlets 214, 216, and 218 of primary charged-particle beam 210. The array of beam-limit apertures can limit the plurality of beamlets 214, 216, and 218. While three beamlets 214, 216, and 218 are shown in FIG. 2, embodiments of the present disclosure are not so limited. For example, in some embodiments, the apparatus 104 may be configured to generate a first number of beamlets. In some embodiments, the first number of beamlets may be in a range from 1 to 1000. In some embodiments, the first number of beamlets may be in a range from 200-500. In an exemplary embodiment, an apparatus 104 may generate 400 beamlets.

Condenser lens 206 can focus primary charged-particle beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for imaging, and can form a plurality of probe spots 270, 272, and 274 on a surface of wafer 230.

Beam separator 222 can be a beam separator of Wien filter type generating an electrostatic dipole field and a magnetic dipole field. In some embodiments, if they are applied, the force exerted by the electrostatic dipole field on a charged particle (e.g., an electron) of beamlets 214, 216, and 218 can be substantially equal in magnitude and opposite in a direction to the force exerted on the charged particle by magnetic dipole field. Beamlets 214, 216, and 218 can, therefore, pass straight through beam separator 222 with zero deflection angle. However, the total dispersion of beamlets 214, 216, and 218 generated by beam separator 222 can also be non-zero. Beam separator 222 can separate secondary charged-particle beams 236, 238, and 240 from beamlets 214, 216, and 218 and direct secondary charged-particle beams 236, 238, and 240 towards secondary optical system 242.

Deflection scanning unit 226 can deflect beamlets 214, 216, and 218 to scan probe spots 270, 272, and 274 over a surface area of wafer 230. In response to the incidence of beamlets 214, 216, and 218 at probe spots 270, 272, and 274, secondary charged-particle beams 236, 238, and 240 may be emitted from wafer 230. Secondary charged-particle beams 236, 238, and 240 may comprise charged particles (e.g., electrons) with a distribution of energies. For example, secondary charged-particle beams 236, 238, and 240 may be secondary electron beams including secondary electrons (energies $\leq 50$ eV) and backscattered electrons (energies between 50 eV and landing energies of beamlets 214, 216, and 218). Secondary optical system 242 can focus secondary charged-particle beams 236, 238, and 240 onto detection sub-regions 246, 248, and 250 of charged-particle detection device 244. Detection sub-regions 246, 248, and 250 may be configured to detect corresponding secondary charged-particle beams 236, 238, and 240 and generate corresponding signals (e.g., voltage, current, or the like) used to reconstruct an SCPM image of structures on or underneath the surface area of wafer 230.

The generated signals may represent intensities of secondary charged-particle beams 236, 238, and 240 and may be provided to image processing system 290 that is in communication with charged-particle detection device 244, primary projection optical system 220, and motorized wafer stage 280. The movement speed of motorized wafer stage 280 may be synchronized and coordinated with the beam deflections controlled by deflection scanning unit 226, such that the movement of the scan probe spots (e.g., scan probe spots 270, 272, and 274) may orderly cover regions of interests on the wafer 230. The parameters of such synchronization and coordination may be adjusted to adapt to different materials of wafer 230. For example, different materials of wafer 230 may have different resistance-capacitance characteristics that may cause different signal sensitivities to the movement of the scan probe spots.

The intensity of secondary charged-particle beams 236, 238, and 240 may vary according to the external or internal structure of wafer 230, and thus may indicate whether wafer 230 includes defects. Moreover, as discussed above, beamlets 214, 216, and 218 may be projected onto different locations of the top surface of wafer 230, or different sides of local structures of wafer 230, to generate secondary charged-particle beams 236, 238, and 240 that may have different intensities. Therefore, by mapping the intensity of secondary charged-particle beams 236, 238, and 240 with the areas of wafer 230, image processing system 290 may reconstruct an image that reflects the characteristics of internal or external structures of wafer 230.

In some embodiments, image processing system 290 may include an image acquirer 292, a storage 294, and a controller 296. Image acquirer 292 may comprise one or more processors. For example, image acquirer 292 may comprise a computer, server, mainframe host, terminals, personal computer, any kind of mobile computing devices, or the like, or a combination thereof. Image acquirer 292 may be communicatively coupled to charged-particle detection device 244 of beam tool 104 through a medium such as an electric conductor, optical fiber cable, portable storage media, IR, Bluetooth, internet, wireless network, wireless radio, or a combination thereof. In some embodiments, image acquirer 292 may receive a signal from charged-particle detection device 244 and may construct an image. Image acquirer 292 may thus acquire SCPM images of wafer 230. Image acquirer 292 may also perform various post-processing functions, such as generating contours, superimposing indicators on an acquired image, or the like. Image acquirer 292 may be configured to perform adjustments of brightness and contrast of acquired images. In some embodiments, storage 294 may be a storage medium such as a hard disk, flash drive, cloud storage, random access memory (RAM), other types of computer-readable memory, or the like. Storage 294 may be coupled with image acquirer 292 and may be used for saving scanned raw image data as original images, and post-processed images. Image acquirer 292 and storage 294 may be connected to controller 296. In some embodiments, image acquirer 292, storage 294, and controller 296 may be integrated together as one control unit.

In some embodiments, image acquirer 292 may acquire one or more SCPM images of a wafer based on an imaging signal received from charged-particle detection device 244. An imaging signal may correspond to a scanning operation for conducting charged particle imaging. An acquired image may be a single image comprising a plurality of imaging areas. The single image may be stored in storage 294. The single image may be an original image that may be divided into a plurality of regions. Each of the regions may comprise one imaging area containing a feature of wafer 230. The acquired images may comprise multiple images of a single imaging area of wafer 230 sampled multiple times over a time sequence. The multiple images may be stored in storage 294. In some embodiments, image processing system 290 may be configured to perform image processing steps with the multiple images of the same location of wafer 230.

In some embodiments, image processing system 290 may include measurement circuits (e.g., analog-to-digital converters) to obtain a distribution of the detected secondary charged particles (e.g., secondary electrons). The charged-particle distribution data collected during a detection time window, in combination with corresponding scan path data of beamlets 214, 216, and 218 incident on the wafer surface, can be used to reconstruct images of the wafer structures under inspection. The reconstructed images can be used to reveal various features of the internal or external structures of wafer 230, and thereby can be used to reveal any defects that may exist in the wafer.

In some embodiments, the charged particles may be electrons. When electrons of primary charged-particle beam 210 are projected onto a surface of wafer 230 (e.g., probe spots 270, 272, and 274), the electrons of primary charged-particle beam 210 may penetrate the surface of wafer 230 for a certain depth, interacting with particles of wafer 230. Some electrons of primary charged-particle beam 210 may elastically interact with (e.g., in the form of elastic scattering or collision) the materials of wafer 230 and may be reflected or recoiled out of the surface of wafer 230. An elastic interaction conserves the total kinetic energies of the bodies (e.g., electrons of primary charged-particle beam 210) of the interaction, in which the kinetic energy of the interacting bodies does not convert to other forms of energy (e.g., heat, electromagnetic energy, or the like). Such reflected electrons generated from elastic interaction may be referred to as backscattered electrons (BSEs). Some electrons of primary charged-particle beam 210 may inelastically interact with (e.g., in the form of inelastic scattering or collision) the materials of wafer 230. An inelastic interaction does not conserve the total kinetic energies of the bodies of the interaction, in which some or all of the kinetic energy of the interacting bodies convert to other forms of energy. For example, through the inelastic interaction, the kinetic energy of some electrons of primary charged-particle beam 210 may cause electron excitation and transition of atoms of the materials. Such inelastic interaction may also generate electrons exiting the surface of wafer 230, which may be referred to as secondary electrons (SEs). Yield or emission rates of BSEs and SEs depend on, e.g., the material under inspection and the landing energy of the electrons of primary charged-particle beam 210 landing on the surface of the material, among others. The energy of the electrons of primary charged-particle beam 210 may be imparted in part by its acceleration voltage (e.g., the acceleration voltage between the anode and cathode of charged-particle source 202 in FIG. 2). The quantity of BSEs and SEs may be more or fewer (or even the same) than the injected electrons of primary charged-particle beam 210.

The images generated by SEM may be used for defect inspection. For example, a generated image capturing a test device region of a wafer may be compared with a reference image capturing the same test device region. The reference image may be predetermined (e.g., by simulation) and include no known defect. If a difference between the generated image and the reference image exceeds a tolerance level, a potential defect may be identified. For another example, the SEM may scan multiple regions of the wafer, each region including a test device region designed as the same, and generate multiple images capturing those test device regions as manufactured. The multiple images may be compared with each other. If a difference between the multiple images exceeds a tolerance level, a potential defect may be identified.

Figure 3A:
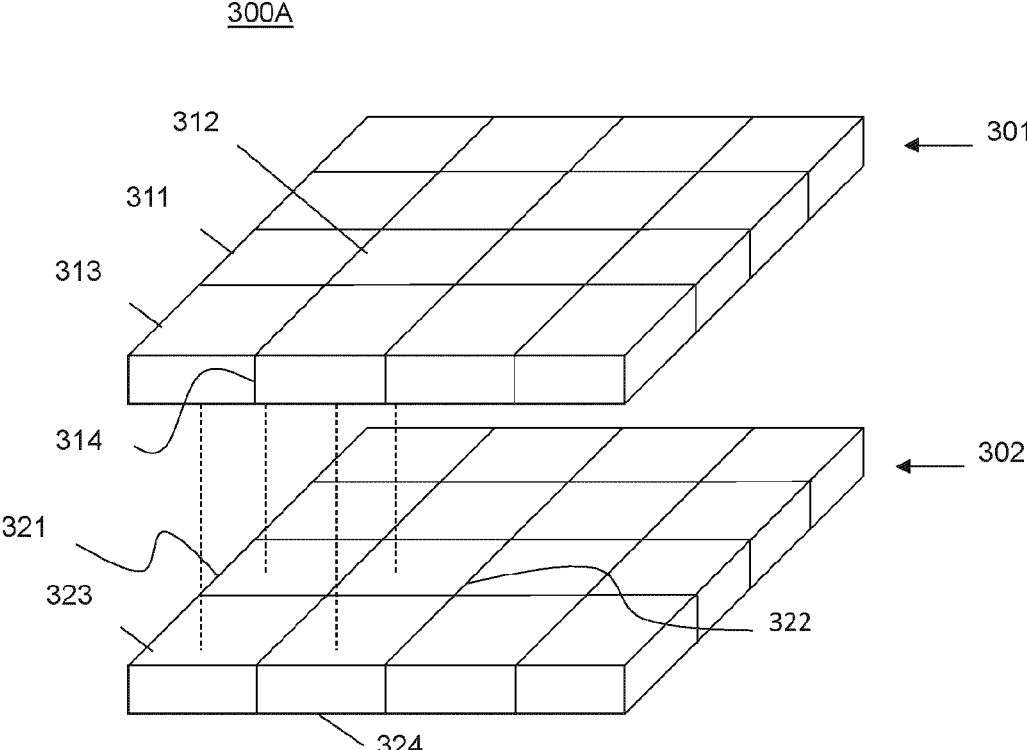
FIGS. 3A-3C are diagrammatic representations of an exemplary structure of a detector, consistent with embodiments of the present disclosure.
Figure 3B:
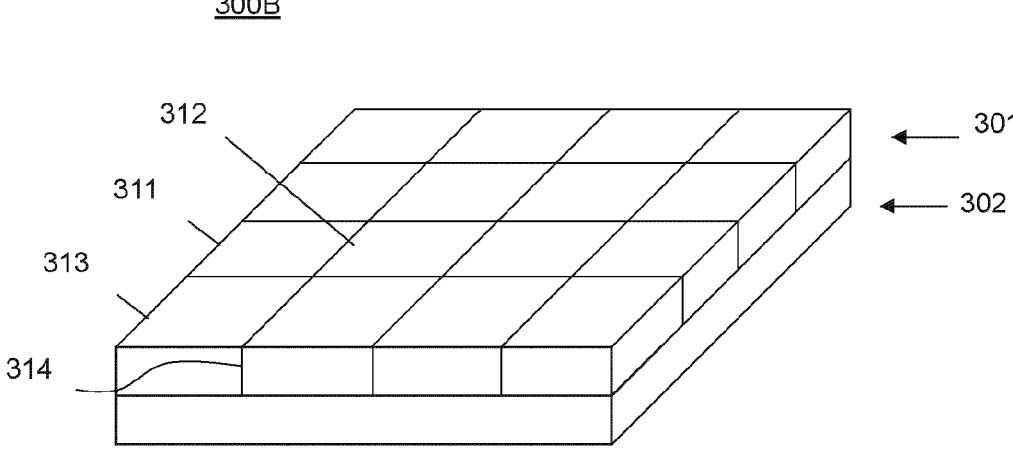
Figure 3C:
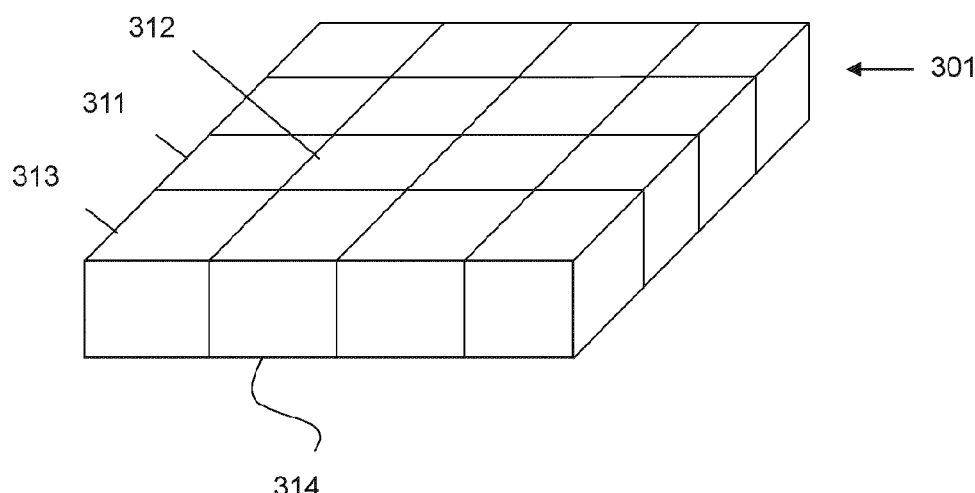

FIGS. 3A-3C illustrate exemplary structures of a detector, consistent with embodiments of the present disclosure. The detector may be a segmented detector. A detector such as detector 300A, detector 300B, or detector 300C (collectively referred to herein as detector 300) as shown in FIGS. 3A-3C may be provided as charged-particle detection device 244 as shown in FIG. 2. In FIG. 3A, detector 300A includes a sensor layer 301 and a readout layer 302. Sensor layer 301 may include a sensor die made up of multiple sensing elements, including sensing elements 311, 312, 313, and 314. In some embodiments, the multiple sensing elements may be provided in an array of sensing elements, each of which may have a uniform size, shape, and arrangement. In some embodiments, the multiple sensing elements may not have a uniform size, shape, or arrangement. The sensing elements may be arranged in a planar, two-dimensional array, the plane of the array being substantially perpendicular to an incidence direction of incoming charged particles. Sensing elements 311, 312, 313, and 314 may include a diode or an element similar to a diode that may convert incident energy into a measurable signal. For example, sensing elements in a detector may include a PIN diode. Throughout this disclosure, sensing elements may be represented as a diode, for example in the figures, although sensing elements or other components may deviate from ideal circuit behavior of electrical elements such as diodes, resistors, capacitors, etc.

Readout layer 302 may include signal processing circuits including signal processing circuits 321, 322, 323, and 324 for processing outputs of the sensing elements. The circuits may include interconnections (e.g., wiring paths) configured to communicatively couple sensing elements. Each sensing element of sensor layer 301 may have a corresponding signal processing circuit in readout layer 302. Sensing elements and their corresponding circuits may be configured to operate independently. As shown in FIG. 3A, signal processing circuits 321, 322, 323, and 324 may be configured to communicatively couple to outputs of sensing elements 311, 312, 313, and 314, respectively, as shown by the four dashed lines between sensor layer 301 and readout layer 302. In some embodiments, readout layer 302 may include input and output terminals. Output(s) of readout layer 302 may be connected to a component for reading and interpreting the output of detector 300. For example, readout layer 302 may be directly connected to a digital multiplexer, digital logic block, controller, computer, or the like.

In some embodiments, readout layer 302 may be configured as a single die with multiple circuits provided thereon. Sensor layer 301 and readout layer 302 may be in direct contact. For example, as shown in FIG. 3B, which shows detector 300B, readout layer 302 directly abut sensor layer 301.

In some embodiments, components and functionality of different layers may be combined or omitted. For example, readout layer 302 may be combined with sensor layer 301. As shown in FIG. 3C, a detector 300C may be provided. Detector 300C may include sensor layer 301. Detector 300C may be configured for back-side illumination, and sensor layer 301 may be the only layer provided. A first side of sensor layer 301 may be configured to receive charged particles, and circuitry may be provided on a second side, opposite from the first side.

Figure 4:
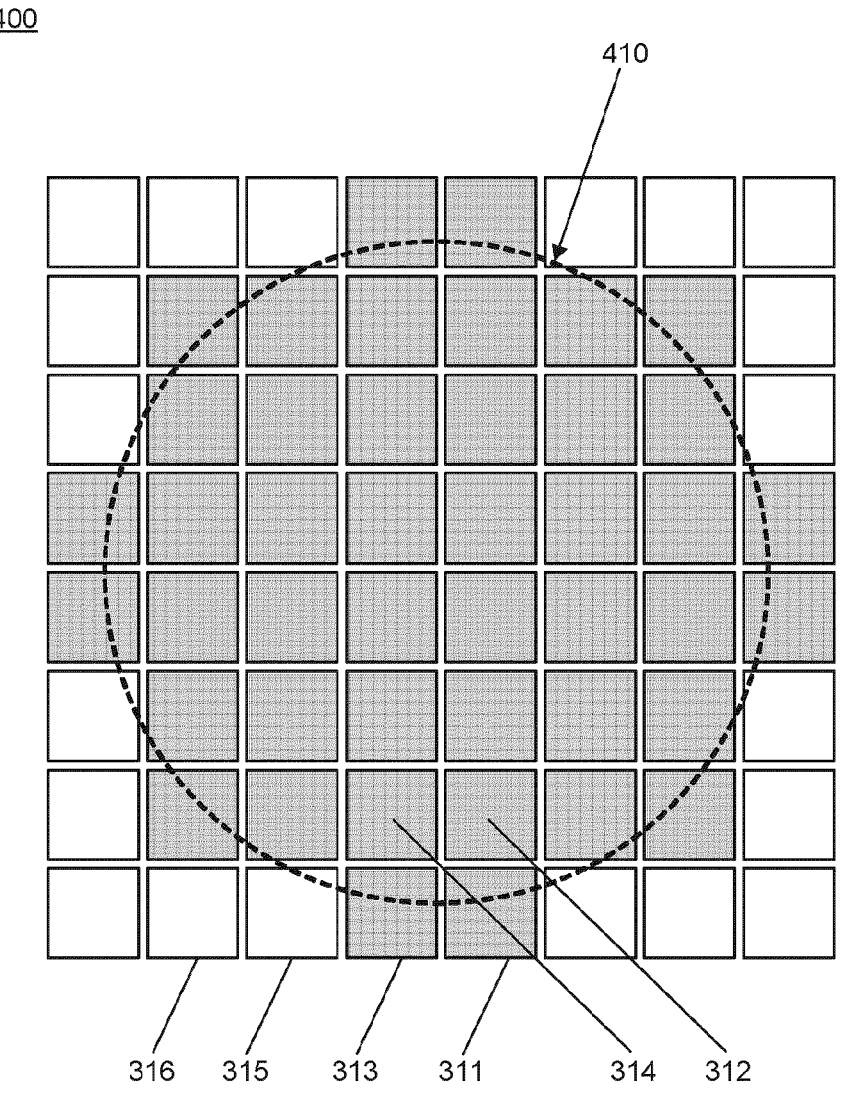
FIG. 4 is a diagram illustrating an exemplary surface of a detector, consistent with embodiments of the present disclosure.

Now reference is made to FIG. 4. FIG. 4 is a diagrammatic representation of a sensor surface of a detector, consistent with embodiments of the disclosure. In some embodiments, sensor surface 400 of a detector may form a surface of charged-particle detection device 244 as shown in FIG. 2. In some embodiments, sensor surface 400 may be a surface of sensor layer 301 of FIGS. 3A-3C. In some embodiments, sensor surface 400 may be a surface on which incoming charged particles are incident. Sensor surface 400 may include an array of sensing elements, including sensing elements 311 to 316.

FIG. 4 shows a spot 410 on sensor surface 400. Some of sensing elements constituting sensor surface 400 may be receiving charged particles (e.g., sensing elements 311, 312, 313, and 314) while some sensing elements are not (e.g., sensing elements 315 and 316). Secondary particles may be formed in response to a primary beam of a charged particle beam apparatus being projected on a wafer, and the secondary particles may be directed to a detector. Although spot 410 is shown to have a generally round shape in FIG. 4, secondary particles may be incident on sensor surface 400 in various other patterns. While FIG. 4 illustrates only one beam (i.e., spot 410) on sensor surface 400, multiple beams can simultaneously be incident on sensor surface 400 according to some embodiments of the present disclosure. While FIG. 4 illustrates 64 (8×8) sensing elements, it will be appreciated that any number of sensing elements may be used.

According to some embodiments of the present disclosure, a detector (e.g., detector 300) may operate in two different modes, i.e., a beam detection mode (hereinafter referred to as a first mode) and a beam intensity detection mode (hereinafter referred to as a second mode). In a first mode, detector 300 may operate to detect a beam pattern or beam position on a sensor surface. For example, detector 300 can detect whether charged particles land on a detection surface or on which sensing elements of detector 300 charged particles land. In some embodiments, detector 300 may scan each sensing element to detect or measure signals from each sensing element. In a first mode, a circuit (e.g., signal processing circuits 321, 322, 323, and 324) in a readout layer (e.g., readout layer 302) may operate to measure signals of a corresponding sensing element. Because an electrical signal from one sensing element is usually very weak, detector 300 may operate in a high gain mode. In some embodiments, the circuit in readout layer 302 can be configured to integrate a signal from a corresponding sensing element for a period of time. In this way, an adequate signal level to determine whether charged particles land on a sensor surface or on which sensing elements of detector 300 charged particles land can be obtained. For example, signals from each sensing element (e.g., sensing elements 311 to 316) on a sensor surface (e.g., sensor surface 400 shown in FIG. 4) can be measured by a corresponding circuit (e.g., signal processing circuits 321, 322, 323, and 324 shown in FIG. 3A). In some embodiments, an intensity map for sensor surface 400 can be generated based on measurements from a first mode operation. In some embodiments, whether charged particles land on a sensor surface or on which sensing elements of detector 300 charged particles land can be determined based on signal measurements of each sensing element or an intensity map of sensor surface 400.

In some embodiments, based on the signal measurements or an intensity map of sensor surface 400 generated from a first mode, one or more sensing elements that receive charged particles constituting one beam can be determined. For example, spot 410 on sensor surface 400 may be formed from one beam as shown in FIG. 4 and some sensing elements (e.g., including sensing elements 311, 312, 313, and 314) can be determined to receive charged particles forming one beam and other sensing elements (e.g., including sensing elements 315 and 316) can be determined to not receive charged particles forming the beam. In a second mode, detector 300 may operate to detect a beam intensity of an individual beam. In a second mode, detector 300 may collectively measure signals from multiples sensing elements that receive charged particles forming one individual beam. For example, detector 300 may measure a sum of signals from sensing elements (e.g., including sensing elements 311, 312, 313, and 314) forming spot 410, which are colored in grey in FIG. 4. Generally, a plurality of sensing elements may receive charged particles of one individual beam and thus, a sum of signals from the plurality of sensing elements may not need to be integrated over a period of time to obtain a meaningful level of signal. In a second mode, detector 300 may detect a beam intensity without integrating signals over a period time and thus, detector 300 may operate at a high speed.

While FIG. 4 illustrates only one beam (i.e., spot 410) on sensor surface 400, multiple beams can simultaneously land on sensor surface 400 according to some embodiments of the present disclosure. Therefore, multiples circuits corresponding to multiple beams may be used to detect a beam intensity of each of multiple beams in a second mode. For example, detector 300 may comprise 38×38 channels in a readout IC to detect beam intensities of 1444 beams. As the number of primary electron beams used by an inspection system (e.g., EBI system 100 of FIG. 1 or beam tool 104 of FIG. 2) increases for higher efficiency and faster speed, the number of readout channels to be used increases. However, the number of readout channels that existing detection systems can accommodate may be restricted by a limited die size or chip area for a readout IC of the detection systems. According to some embodiments of the present disclosure, a readout circuit that can be used in both modes (i.e., a first mode and a second mode) in a charged particle beam detector can be provided.

Further, in a second mode, existing detection systems may suffer from nonuniform bandwidths among multiple readout channels for multiple beams. In some embodiments, positions of multiple beams on sensor surface 400 are not known until a detector scans each sensing element by a first mode operation, and sizes of multiple beams may not be uniform. It is also not known which sensing element and how many sensing elements would be connected to which readout channel in a second mode until a detector completes the first mode operation. Further, the number of sensing elements receiving charged particles forming one beam may be different from the number of sensing elements receiving charged particles forming another beam. In some embodiments, each sensing element may have a different size or characteristics from that of other sensing elements. In some embodiments, input capacities may not be uniform among multiple readout channels, which may result in nonuniform bandwidths among multiple readout channels. When multiple readout channels have different system bandwidths, an image reconstruction quality of a wafer may be deteriorated. According to some embodiments of the present disclosure, a uniform bandwidth can be achieved among multiple channels processing multiple beams, which enables the improvement of reconstructed image quality. According to some embodiments of the present disclosure, a bandwidth of a readout channel can be adjusted after sensing elements are connected or determined to be connected to the readout channel for its second mode operation.

Figure 5:
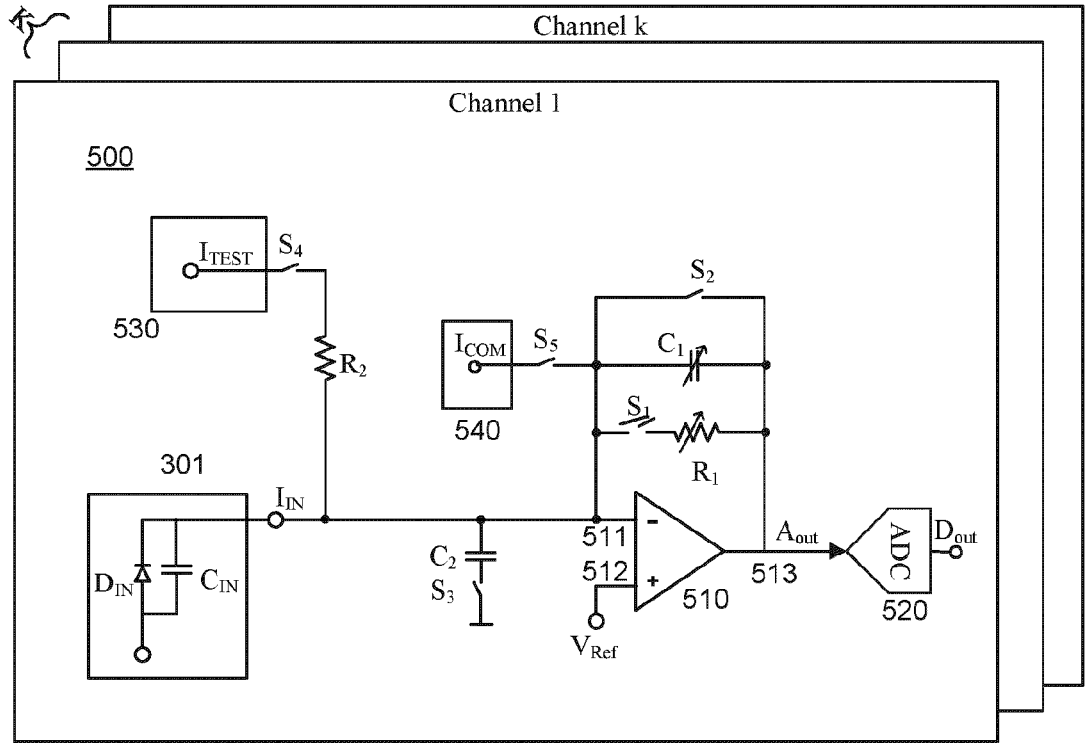
FIG. 5 is a diagrammatic representation of a readout circuit associated with a sensor layer, consistent with embodiments of the present disclosure.

Reference is now made to FIG. 5, which is a diagrammatic representation of a readout circuit associated with a sensor layer, consistent with embodiments of the present disclosure. Circuit 500 may be provided at the sensing element level of a detector, such as electron detection device 244 of FIG. 2. According to some embodiments of the present disclosure, circuit 500 may operate in two different operation modes, i.e., a beam detection mode (i.e., a first mode) and a beam intensity detection mode (i.e., a second mode). Circuit 500 may be one of a plurality of signal processing circuits (e.g., 321 to 324 in FIG. 3A), each of which is provided for a corresponding sensing element (e.g., 311 to 314 in FIG. 3A). In some embodiments, a detector may include only one sensing element and only one circuit 500 may be provided. In some embodiments, circuit 500 may be provided in a layer where sensing elements in a detector are formed (e.g., integrated with sensing elements), or in another layer. For example, circuit 500 may be provided in sensor layer 301 of FIG. 3, or may be provided in another layer. In some embodiments, some signal processing circuits among signal processing circuits (e.g., 321 to 324 in FIG. 3A) may have circuit 500 capable of operating in first and second modes and some other signal processing circuits may have a circuit capable of operating in one mode (e.g., first mode) in that the number of beams used in a tool (e.g., tool 104 of FIG. 2) may be less than the number of sensing elements used in a detector.

According to some embodiments of the present disclosure, circuit 500 may be configured to process signals generated from sensor layer 301. Sensor layer 301 may be configured to generate a response to charged particles incident on sensor surface 400. In some embodiments, one or more sensing elements of sensor layer 301 may be communicatively coupled to circuit 500. Charges or current may be generated within a sensing element in response to charged particle arrival and may be fed to circuit 500 connected to the sensing element. In some embodiments, one sensing element may be connected to circuit 500 in a first mode and a set of multiple sensing elements may be connected to circuit 500 in a second mode. In some embodiments, a connection between sensing element(s) and circuit 500 can be implemented by one or more switches and wiring paths among the sensing element(s), circuit 500, and switches.

As shown in FIG. 5, circuit 500 includes an amplifier 510, a first resistor $R_1$ connected between a first input terminal 511 of amplifier 510 and an output terminal 513 of amplifier 510, and a first capacitor $C_1$ connected between first input terminal 511 and output terminal 513. In some embodiments, circuit 500 may further include first switch $S_1$ connected in series with first resistor $R_1$ between first input terminal 511 and second input terminal 512 of amplifier 510. First input terminal 511 of amplifier 510 can be coupled to sensor layer 301 to receive signals from sensor layer 301. A second input terminal 512 of amplifier 510 may be coupled to a reference voltage $V_{ref}$. In some embodiments, reference voltage $V_{ref}$ of may be set as a non-zero voltage. In some embodiments, first input terminal 511 can be an inverting input terminal of amplifier 510 and second input terminal 512 can be a non-inverting input terminal of amplifier 510 as shown in FIG. 5. Amplifier 510 may be configured to have a low input impedance such that all or substantially all charges are extracted from sensing elements quickly after they are generated in sensor layer 301.

According to some embodiments of the present disclosure, circuit 500 is configured to operate in two different modes, i.e., a first mode and a second mode. According to some embodiments of the present disclosure, first capacitor $C_1$ may have different functions per mode. For example, first capacitor $C_1$ can be configured to operate as an integration capacitor in a first mode and as a feedback capacitor in a second mode.

Hereinafter, an operation of circuit 500 in a first mode will be explained. In the first mode, one sensing element of sensor layer 301 can be connected to circuit 500. A sensing element may be configured to operate with a bias applied such that a depletion region is formed in a sensing element that may act as a capture region for incoming charged particles. Incoming charged particles may interact with the material of a sensing element and may generate charges through impact ionization. As shown in FIG. 5, a sensing element may be represented by a diode $D_{IN}$ and an input capacitor $C_{IN}$ connected in parallel. In some embodiments, diode $D_{IN}$ may generate a input current $I_{IN}$ in response to incoming charged particles. Input capacitor $C_{IN}$ may represent PIN diode junction capacitance. In some embodiments, additional circuitry (e.g., other electrical components or wiring) may be provided with a diode, and the diode and its associated circuitry may be modeled as a circuit.

In the first mode, circuit 500 can be configured to operate as an integrator of an input signal over a certain time period. In the first mode, first resistor $R_1$ may be disconnected by opening first switch $S_1$. In some embodiments, first resistor $R_1$ can be an adjustable resistor and a resistance value of first resistor $R_1$ may be set to a large value such that first resistor $R_1$ acts as if being disconnected for a certain time period for integration. In the first mode, amplifier 510 may operate as a charge transfer amplifier and integrate input current $I_{IN}$ over a certain time period.

In the first mode, first capacitor $C_1$ functions as an integration capacitor. Amplifier 510 may integrate input current $I_{IN}$ by charging charges on first capacitor $C_1$ over a certain period time. An output signal $A_{out}$ of amplifier 510 can be an output voltage that is proportional to the integral of the input current $I_{IN}$ over a certain time period. The magnitude of the output signal $A_{out}$ of amplifier 510 can be proportional to the length of time for integration. In some embodiments, an amplification gain of amplifier 510 can be controlled by adjusting a capacitance value of first capacitor $C_1$. According to the charge-voltage relationship of capacitors, a gain of amplifier 510 may be inversely proportional to a capacitance value of first capacitor $C_1$. For example, in order to increase a gain of amplifier 510, first capacitor $C_1$ can be adjusted to have a smaller capacitance value. Inversely, to reduce a gain of amplifier, first capacitor $C_1$ can be adjusted to have a larger capacitance value.

According to some embodiments of the present disclosure, circuit 500 may further comprise a second switch $S_2$ connected between first input terminal 511 and output terminal 513 of amplifier 510. Second switch $S_2$ may be a reset switch for integration used in a first mode. In some embodiments, an integration of input signal $I_{IN}$ can be integrated over a certain time period. After the certain time period, second switch $S_2$ may be closed such that first capacitor $C_1$ can be discharged and thus, no charges remain on first capacitor $C_1$ for a next integration interval. After first capacitor $C_1$ is completely discharged, second switch $S_2$ can be off for a next integration process.

Now, an operation of circuit 500 in a second mode will be explained. In the second mode, multiple sensing elements of sensor layer 301 may be connected to circuit 500. For example, multiple sensing elements that receive charged particles forming one beam can be connected to circuit 500. While not shown in FIG. 5, multiple sensing elements may be connected in parallel when the multiple sensing elements are connected to circuit 500. For example, multiple pairs of diode $D_{IN}$ and input capacitor $C_{IN}$ can be connected in parallel. In this example, input current $I_{IN}$ can be a sum of multiple input currents from multiple diodes $D_{IN}$ and total input capacitance can be a sum of capacitances of multiple input capacitors $C_{IN}$.

In the second mode, first resistor $R_1$ is connected by closing first switch $S_1$. In the second mode, circuit 500 can be configured to operate amplifier 510 as a transimpedance amplifier. Amplifier 510 may be configured to convert input current $I_{IN}$ to a proportional output voltage, i.e., output signal $A_{out}$. In some embodiments, first resistor $R_1$ can be an adjustable resistor and a resistance value of first resistor $R_1$ may be set to control a gain of amplifier 510. In the second mode, output signal $A_{out}$ of amplifier 510 is proportional to a resistance value of first resistor $R_1$. In some embodiments, output signal $A_{out}$ of amplifier 510 can be determined based on input current $I_{IN}$ and a resistance value of first resistor $R_1$. In some embodiments, a resistance value of first resistor $R_1$ can be adjusted to obtain a target gain of amplifier 510, e.g., per design requirements, etc.

In the second mode, first capacitor $C_1$ may operate to stabilize an operation of circuit 500. Amplifier 510 may consist of some values of input capacitance and stray capacitance across its input terminals, which may cause output drift and ringing oscillation, making the entire circuit unstable. In some embodiments, first capacitor $C_1$ may function to resolve such an issue of circuit 500 by being connected in parallel with first resistor $R_1$ between first input terminal 511 and output terminal 513 of amplifier 510.

In the second mode, a bandwidth of circuit 500 may depend on a capacitance value of first capacitor $C_1$. A bandwidth of an amplifier or a circuit comprising the amplifier may be defined as the frequency range over which a gain of the amplifier is above 70.7% or −3 dB (where 0 dB is the maximum value) of its maximum output value. It is appreciated that an operation of an amplifier or a circuit comprising the amplifier is stable within the bandwidth. In some embodiments, to obtain a stable operation of an amplifier or a circuit comprising the amplifier in the entire range equal to or less than a certain bandwidth frequency $f_p$, a capacitance value of a feedback capacitor may be set to satisfy Equation 1 below:

$$C_1 \le \frac{1}{2\pi \times R_1 \times f_\rho}. \qquad \text{(Equation 1)}$$

According to some embodiments of the present disclosure, the bandwidth of circuit 500 can be adjusted by controlling a capacitance value of first capacitor $C_1$. In some embodiments, first capacitor $C_1$ can be an adjustable capacitor and a capacitance value of first capacitor $C_1$ may be set to control a bandwidth of amplifier 510 or circuit 500.

A bandwidth of amplifier 510 or circuit 500 can be determined by first capacitor $C_1$ and input capacitance $C_{IN}$ of sensor layer 301. In some embodiments, circuit 500 may have a target bandwidth or target bandwidth range such that an image of a wafer can adequately be reconstructed. In the second mode, sensing elements connected to circuit 500 or the number of sensing elements connected to circuit 500 may change depending on a beam size or a beam position on sensor surface 400. Thereby, input capacitance $C_{IN}$ connected to circuit 500 may change per beam, and an overall bandwidth of circuit 500 may change depending on the connected input capacitance $C_{IN}$. In some embodiments, a capacitance value of first capacitor $C_1$ can be adjusted such that circuit 500 or amplifier 510 has a certain range of a bandwidth or a certain bandwidth regardless of the connected sensing elements or input capacitance $C_{IN}$ In some embodiments, a capacitance value of first capacitor $C_1$ can be adjusted such that circuit 500 or amplifier 510 can have a constant bandwidth independent from the number of connected sensing elements or the connected sensing elements. For example, when input capacitor GIN having a smaller capacitance is connected, first capacitor $C_1$ may be adjusted to have a larger capacitance value to decrease a bandwidth of circuit 500 or amplifier 510. Inversely, when input capacitor $C_{IN}$ having a larger capacitance is connected, first capacitor $C_1$ may be adjusted to have a smaller capacitance value to increase a bandwidth of circuit 500 or amplifier 510.

In some embodiments, detector 300 may have a plurality of channels, e.g., k number of channels as shown in FIG. 5. In some embodiments, each channel may implement circuit 500. In some embodiments, a first group of sensing elements, which receive charged particles forming a first beam, can be connected to a circuit (e.g., circuit 500) of a first channel and a second group of sensing elements, which receive charged particles forming a second beam, can be connected to a circuit (e.g., circuit 500) of a second channel. Similarly, a $k^{th}$ group of sensing elements, which receive charged particles forming a $k^{th}$ beam, can be connected to a circuit (e.g., circuit 500) of a $k^{th}$ channel. As beams may have different sizes each other on a sensor surface and sensing elements receiving charged particles forming each beam may also be different per beam, a capacitance value of input capacitor $C_{IN}$ connected to circuit 500 may be different per channel. A detector may have a uniform bandwidth over multiple channels, e.g., channels 1 to k to adequately reconstruct an image for a wafer. In some embodiments, a capacitance value of first capacitor $C_1$ of multiple channels may be adjusted to control a system bandwidth of a corresponding circuit such that multiple channels 1 to k have a uniform bandwidth. While some embodiments are explained with respect to circuit 500 on first channel 1, it will be appreciated that the present disclosure may be applicable to multiple channels.

Referring back to FIG. 5, circuit 500 may further comprise an analog-to-digital converter (ADC) 520. In some embodiments, ADC 520 may function the same in both modes. In FIG. 5, ADC 520 may be communicatively coupled to output terminal 513 of amplifier 510 to convert the analog output signals (e.g., output signal $A_{out}$) of amplifier 510 to digital signals. Circuit 500 may also include other circuits for other functions. For example, circuit 500 may further comprise an additional amplifier between amplifier 510 and ADC 520 so that output signal $A_{out}$, of amplifier 510 can further be amplified or modified before output signal $A_{out}$ is inputted to ADC 520. In some embodiments, ADC 520 may include an output terminal communicatively coupled to a component (e.g., a component inside or outside readout layer 302 of detector 300) for reading and interpreting the digital signal converted by ADC 520. In some embodiments, a digital output signal $D_{out}$ may be transmitted to a data processing stage (e.g., image processing system 290 in FIG. 2).

In some embodiments, circuit 500 may further comprise a second capacitor $C_2$ connected at first input terminal 511 of amplifier 510. In some embodiments, second capacitor $C_2$ can be connected in parallel with input capacitor $C_{IN}$ at first input terminal 511. When input capacitor $C_{IN}$ connected to circuit 500 is too small, circuit 500 may become unstable. In some embodiments, circuit 500 may further comprise a third switch $S_3$ such that a connection of second capacitor $C_2$ to circuit 500 can be controlled by third switch $S_3$. For example, third switch $S_3$ is closed when input capacitance $C_{IN}$ is less than a certain threshold value such that second capacitor $C_2$ is connected to circuit 500. Inversely, third switch $S_3$ stays open when input capacitance $C_{IN}$ is equal to or greater than a certain threshold value such that second capacitor $C_2$ is not connected to circuit 500.

According to some embodiments of the present disclosure, circuit 500 may further comprise a bandwidth tester 530 that is configured to determine a system bandwidth of circuit 500. In some embodiments, a test current $I_{TEST}$ can be provided by bandwidth tester 530 to first input terminal 511 of amplifier 510. In some embodiments, bandwidth tester 530 may comprise a current generator configured to generate test current $I_{TEST}$. As shown in FIG. 5, test current $I_{TEST}$ may be provided to circuit 500 via a second resistor $R_2$ to increase stability of the system. As shown in FIG. 5, circuit 500 may further comprise a fourth switch $S_4$ such that a connection of bandwidth tester 530 to circuit 500 can be controlled by fourth switch $S_4$.

In some embodiments, bandwidth tester 530 can be coupled to circuit 500 in a calibration phase by closing fourth switch $S_4$. In some embodiments, calibration may be performed after a first mode operation of circuit 500 and before a second mode operation of circuit 500. For example, after a first mode operation of circuit 500, it can be determined which sensing elements and how many sensing elements are connected to circuit 500. After coupling the determined sensing elements to first input terminal 511 of amplifier 510, fourth switch $S_4$ can be closed to couple bandwidth tester 530 to circuit 500 and a calibration phase may get started. According to some embodiments, a system bandwidth of circuit 500 can be determined based on a shape of an output signal of circuit 500 upon application of test current $I_{TEST}$ to circuit 500.

In a calibration phase, test current $I_{TEST}$ is coupled to first input terminal 511. In some embodiments, fourth switch $S_4$ may be opened after feeding test current $I_{TEST}$ to first input terminal 511 for a certain period of time. Once fourth switch $S_4$ is opened, feeding of test current $I_{TEST}$ to circuit 500 is ceased. In some embodiments, a system bandwidth of circuit 500 can be determined based on output signal (e.g., output signal $A_{out}$ or digital output signal $D_{out}$) after ceasing the feed of test current $I_{TEST}$. In some embodiments, a system bandwidth of circuit 500 can be determined based on a shape of an output signal after ceasing the feed of test current $I_{TEST}$.

Figure 6:
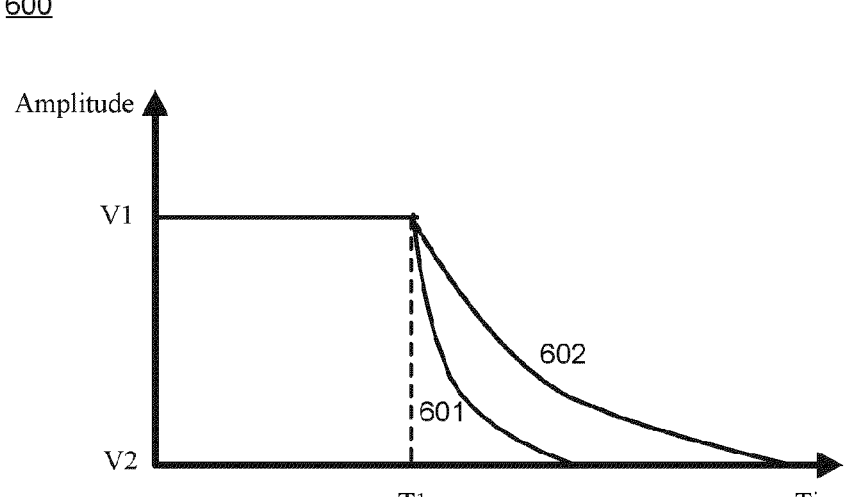
FIG. 6 illustrates an output signal of a readout circuit of FIG. 5, which may indicate a system bandwidth.

FIG. 6 illustrates an output signal of circuit 500, which may indicate a system bandwidth. In FIG. 6, the release time of test current $I_{TEST}$ is indicated as T1. As shown in FIG. 6, the amplitude of an output signal may be maintained at a first level V1 and, after release time T1, an output signal may start dropping from first level V1 to a second level V2. An output signal may show exponential decay from first level V1 to second level V2 after release time T1. In some embodiments, second level V2 may be an amplitude of an output signal of circuit 500 without applying test current $I_{TEST}$ and first level V1 may be an amplitude of an output signal of circuit 500 with applying test current $I_{TEST}$. In some embodiments, a system bandwidth of circuit 500 can be determined based on a decay rate from first level V1 to second level V2. When circuit 500 has a lower bandwidth, the decay rate of an output signal may be lower and the decay of an output signal from first level V1 to second level V2 may take longer. For example, a decay rate of first signal 601 is greater than that of second signal 602, which may mean that first signal 601 indicates a higher system bandwidth while second signal 602 indicates a lower system bandwidth. In some embodiments, a system bandwidth of circuit 500 can be determined by observing or measuring a decay rate or decay speed of an output signal of circuit 500.

While determining a system bandwidth of circuit 500 based on a decay shape of the output signal of circuit 500 has been illustrated with respect to FIG. 6, it will be appreciated that a system bandwidth of circuit 500 can similarly be determined based on a growth shape of an output signal of circuit 500 after test current $I_{TEST}$ is applied to circuit 500. Upon supply of test current $I_{TEST}$ to circuit 500 begins, an output signal of circuit 500 may start rising from one level (e.g., second level V2 in FIG. 6) to another level (e.g., first level V1 in FIG. 6), which is not shown. An output signal may show exponential growth from second level V2 to first level V1. In some embodiments, a system bandwidth of circuit 500 can be determined based on a growth rate or growth speed from second level V2 to first level V1. When circuit 500 has a lower bandwidth, the growth rate of an output signal may be lower and the growth of an output signal from second level V2 to first level V1 may take longer. In some embodiments, a system bandwidth of circuit 500 can also be determined by observing or measuring a growth rate or growth speed of an output signal of circuit 500.

According to some embodiments of the present disclosure, a system bandwidth of circuit 500 may be adjusted based on the determined system bandwidth and a target bandwidth for circuit 500. In some embodiments, a system bandwidth of circuit 500 can be controlled by adjusting a capacitance value of first capacitor $C_1$. For example, when the determined system bandwidth is less than a target bandwidth, first capacitor $C_1$ can be adjusted to have a smaller capacitance value to increase an overall system bandwidth. On the contrary, when the determined system bandwidth is greater than a target bandwidth, first capacitor $C_1$ can be adjusted to have a larger capacitance value to decrease an overall system bandwidth.

While multiple channels of a detector may comprise their own bandwidth tester 530, one bandwidth tester may be shared by multiple channels according to some embodiments of the present disclosure. For example, each channel may be coupled to bandwidth tester 530 via its own switch and resistor, and test current $I_{TEST}$ can be provided to multiple channels simultaneously or sequentially by controlling switches.

Referring back to FIG. 5, circuit 500 may further comprise an offset trimmer 540. In some embodiments, offset trimmer 540 may be configured to compensate an offset in output signal $A_{out}$ of amplifier 510. There may be a small difference between an input voltage needed to produce zero volts at output terminal 513 of amplifier 510 and zero volts. The input voltage may be an electric potential difference between first input terminal 511 and second input terminal 512 of amplifier 510. When the input voltage is zero, amplifier 510 may produce a non-zero voltage at output terminal 513. In some embodiments of the present disclosure, offset trimmer 540 may provide a compensation current $I_{COM}$ to circuit 500. In some embodiments, compensation current $I_{COM}$ can be provided to compensate an offset input voltage such that amplifier 510 can produce zero volts when an input voltage is zero. In some embodiments, offset trimmer 540 may be coupled to circuit 500 via a fifth switch $S_5$ as shown in FIG. 5 such that a connection of offset trimmer 540 to circuit 500 can be controlled by fifth switch $S_5$. In some embodiments, offset trimmer 540 may be coupled to first input terminal 511 of amplifier 510. A diode in a sensing element may generate a current (referred to as a dark current) even when the sensing element does not receive charged particles, which leads to wrong interpretation of signals from sensor layer. In some embodiments, offset trimmer 540 may be used to compensate the dark current from sensor layer 301.

According to some embodiments of the present disclosure, a readout circuit that can be used in a beam detection mode and in a beam intensity detection mode in a charged particle beam detector can be provided. According to some embodiments of the present disclosure, one capacitor component may be used to perform different roles in two different modes. According to some embodiments of the present disclosure, some issues occurred due to a limited area on a readout IC of a charged particle beam detector or detection system can be alleviated or resolved. According to some embodiments of the present disclosure, a readout circuit can be controlled to have a constant bandwidth regardless of a connected sensing element or the number of connected sensing elements. According to some embodiments of the present disclosure, a uniform bandwidth can be achieved among multiple channels processing multiple beams, which enables the improvement of reconstructed image quality.

Figure 7:
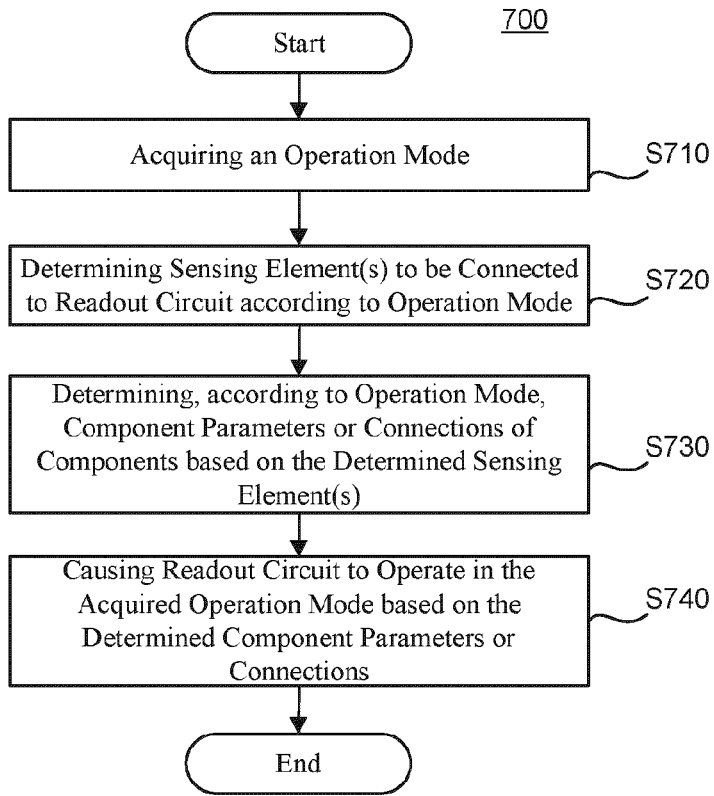
FIG. 7 is a flowchart of an exemplary method of operating a readout circuit, consistent with embodiments of the present disclosure.

FIG. 7 is a flowchart of an exemplary method of operating a readout circuit, consistent with embodiments of the present disclosure. In some embodiments, a readout circuit can be circuit 500 shown in FIG. 5. In some embodiments, method 700 may be performed by a detector (e.g., detector 300 in FIGS. 3A-3C). In some embodiments, method 700 may be performed by a controller of the charged-particle inspection system (e.g., controller 109 of EBI system 100 in FIG. 1). The controller may include circuitry (e.g., a memory and a processor) programmed to implement method 700. For example, the controller may be an internal controller or an external controller (e.g., controller 109 in FIG. 1) coupled with the charged-particle inspection system.

In step S710, an operation mode of a readout circuit can be acquired. In some embodiments, the operation mode may comprise a first mode and a second mode. In some embodiments, a detector or a controller may receive an instruction indicating one of the first mode or the second mode.

In step S720, sensing element(s) to be connected to a readout circuit can be determined according to the acquired operation mode in step S710. At step S720, which sensing element(s) or how many sensing elements are to be connected to circuit 500 can be determined according to the acquired operation mode, i.e., a first mode or a second mode. One sensing element may be connected to circuit 500 in the first mode and a set of multiple sensing elements are connected to circuit 500 in the second mode. In some embodiments, the set of multiple sensing elements may be sensing elements that receive charged particles forming one beam on a sensor surface.

In step S730, according to the acquired operation mode, component parameters or connections of components can be determined based on the determined sensing element(s) in step S720. At step S730, parameters of components of circuit 500 or connections of components in circuit 500 can be determined based on the sensing element(s) connected to circuit 500 per the determined operation mode.

In the first mode, amplifier 510 may operate as a charge transfer amplifier and integrate input current $I_{IN}$ over a certain time period. In some embodiments, it can be determined that first resistor $R_1$ is disconnected or that a resistance value of first resistor $R_1$ is set to a large value such that first resistor $R_1$ acts as if being disconnected for a certain time period. In some embodiments, a capacitance value of first capacitor $C_1$ can be determined to obtain a target gain of circuit 500. For example, in order to increase a gain of amplifier 510, a capacitance value of first capacitor $C_1$ can be determined to have a smaller value. Inversely, to reduce a gain of amplifier 510, a capacitance value of first capacitor $C_1$ can be determined to have a larger value. In some embodiments, it can be determined that second capacitor $C_2$ is connected to circuit 500 when a capacitance value of input capacitor $C_{IN}$ is less than a certain threshold value. In some embodiments, it can be determined that offset trimmer 540 is connected to circuit 500 such that compensation current $I_{COM}$ can be provided to circuit 500 to compensate an offset in output signal $A_{out}$ of amplifier 510 or a dark current from sensor layer 301.

In the second mode, amplifier 510 may operate as a transimpedance amplifier. In some embodiments, it can be determined that first resistor $R_1$ is connected. In some embodiments, a resistance value of first resistor $R_1$ can be determined to obtain a target gain of circuit 500. In some embodiments, output signal $A_{out}$ of amplifier 510 is proportional to a resistance value of first resistor $R_1$. In some embodiments, a capacitance value of first capacitor $C_1$ can be determined to obtain a target gain of circuit 500. For example, in order to decrease a bandwidth of circuit 500, a capacitance value of first capacitor $C_1$ can be determined to have a larger value. Inversely, to increase a bandwidth of circuit 500, a capacitance value of first capacitor $C_1$ can be determined to have a smaller value. In some embodiments, in order to determine a capacitance value of first capacitor $C_1$, a system bandwidth of circuit 500 before adjustment may be measured or observed by using bandwidth tester 530. In some embodiments, it can be determined that second capacitor $C_2$ is disconnected from circuit 500 when a capacitance value of input capacitor $C_{IN}$ is equal to or greater than a certain threshold value. In some embodiments, it can be determined that offset trimmer 540 is connected to circuit 500 such that compensation current $I_{COM}$ can be provided to circuit 500 to compensate an offset in output signal $A_{out}$ of amplifier 510 or a dark current from sensor layer 301.

In step S740, a readout circuit is caused to operate in the operation mode based on the determined component parameters or connections. At step S740, a detector or controller causes circuit 500 to operate in the corresponding mode based on the determined parameters of components of circuit 500 or connections of components in circuit 500. When the operation mode is the first mode, circuit 500 may operate in the first mode to detect whether charged particles are incident on an associated sensing element. When the operation mode is the second mode, circuit 500 may operate in the second mode to detect a beam intensity from signals of multiple sensing elements on which charged particles forming one beam are incident.

A non-transitory computer-readable medium may be provided that stores instructions for a processor of a controller (e.g., controller 109 in FIG. 1) for detecting charged particles according to the exemplary flowchart of FIG. 7, consistent with embodiments of the present disclosure. For example, the instructions stored in the non-transitory computer-readable medium may be executed by the circuitry of the controller for performing method 700 in part or in entirety. Common forms of non-transitory media include, for example, a floppy disk, a flexible disk, hard disk, solid-state drive, magnetic tape, or any other magnetic data storage medium, a Compact Disc Read-Only Memory (CD-ROM), any other optical data storage medium, any physical medium with patterns of holes, a Random Access Memory (RAM), a Programmable Read-Only Memory (PROM), and Erasable Programmable Read-Only Memory (EPROM), a FLASH-EPROM or any other flash memory, Non-Volatile Random Access Memory (NVRAM), a cache, a register, any other memory chip or cartridge, and networked versions of the same.

The embodiments may further be described using the following clauses:

1. A circuit for a charged particle detector comprising:
   an amplifier configured to receive a signal representing an output of a sensor layer and comprising a first input terminal and an output terminal;
   a capacitor connected between the first input terminal and the output terminal; and
   a resistor connected in parallel with the capacitor between the first input terminal and the output terminal;
   wherein the circuit is configured to operate in a first mode and a second mode, and
   wherein the capacitor is adjustable using a capacitance value of the capacitor to enable control of a gain of the circuit operating in the first mode and control of a bandwidth of the circuit operating in the second mode.
2. The circuit of clause 1, further comprising a switch connected in series with the resistor between the first input terminal and the output terminal,
   wherein the switch is open in the first mode.
3. The circuit of clause 1 or clause 2, wherein the resistor is adjustable using a resistance value of the resistor to enable control of a gain of the circuit operating in the second mode.
4. The circuit of any one of clauses 1-3, wherein the output of the sensor layer represents an output of one sensing element in the sensor layer in the first mode, and
   wherein the output of the sensor layer represents an output of multiple sensing elements in the sensor layer in the second mode.
5. The circuit of any one of clauses 1-4, further comprising:
   a tester configured to provide a test current to the first input terminal, wherein the test current enables the circuit to generate an output signal indicative of a bandwidth of the circuit.
6. The circuit of clause 5, wherein the tester is configured to stop providing the test current, which enables the circuit to generate the output signal having a decay shape indicative of the bandwidth of the circuit.
7. The circuit of clause 5, wherein the test current enables the circuit to generate the output signal having a growth shape indicative of the bandwidth of the circuit.
8. The circuit of any one of clauses 1-7, further comprising:
   an offset trimmer configured to provide a compensation current to the first input terminal to enable compensating an output signal offset of the amplifier.
9. The circuit of any one of clauses 1-8, wherein the amplifier is configured to operate as a charge transfer amplifier in the first mode and as a transimpedance amplifier in the second mode.
10. A charged particle detector comprising:
    a sensor layer comprising a plurality of sensing elements; and
    a circuit comprising:
       an amplifier configured to receive a signal representing an output of the sensor layer and comprising a first input terminal and an output terminal;
       a capacitor connected between the first input terminal and the output terminal; and
       a resistor connected in parallel with the capacitor between the first input terminal and the output terminal,
    wherein the circuit is configured to operate in a first mode and a second mode, and wherein the capacitor is adjustable using a capacitance value of the capacitor to enable control of a gain of the circuit operating in the first mode and control of a bandwidth of the circuit operating in the second mode.

11. The detector of clause 9, wherein the circuit further comprises:

a switch connected in series with the resistor between the first input terminal and the output terminal, wherein the switch is open in the first mode.

12. The detector of clause 10 or clause 11, wherein the resistor is adjustable using a resistance value of the resistor to enable control of a gain of the circuit operating in the second mode.

13. The detector of any one of clauses 10-12, wherein the output of the sensor layer represents an output of one sensing element among the plurality of sensing elements in the first mode, and wherein the output of the sensor layer represents an output of a set of multiple sensing elements among the plurality of sensing elements in the second mode.

14. The detector of any one of clauses 10-13, wherein the circuit further comprises:

a tester configured to provide a test current to the first input terminal, wherein the test current enables the circuit to generate an output signal indicative of a bandwidth of the circuit.

15. The detector of clause 14, wherein the tester is configured to stop providing the test current, which enables the circuit to generate the output signal having a decay shape indicative of the bandwidth of the circuit.

16. The detector of clause 14, wherein the test current enables the circuit to generate the output signal having a growth shape indicative of the bandwidth of the circuit.

17. The detector of any one of clauses 10-16, wherein the circuit further comprises:

an offset trimmer configured to provide a compensation current to the first input terminal to enable compensating an output signal offset of the amplifier.

18. The detector of any one of clauses 10-17, wherein the amplifier is configured to operate as a charge transfer amplifier in the first mode and as a transimpedance amplifier in the second mode.

19. A computer-implemented method for operating a circuit for a charged particle detector, the method comprising:

acquiring an operation mode of the circuit, the operation mode comprising a first mode and the second mode, wherein the circuit comprises:

an amplifier configured to receive a signal representing an output of a sensor layer and having a first input terminal and an output terminal, and a capacitor connected between the first input terminal and the output terminal;

determining a set of one or more sensing elements in the sensor layer to be connected to the circuit according to the acquired operation mode, wherein one sensing element is coupled to the circuit in the first mode and a set of multiple sensing elements are coupled to the circuit in the second mode;

determining, according to the acquired operation mode, a capacitance value of the capacitor based on the determined set of one or more sensing elements; and causing the circuit to operate in the acquired operation mode based on the determined capacitance value of the capacitor, wherein the capacitance value of the capacitor is determined to obtain a target gain of the circuit in the first mode and to obtain a target bandwidth of the circuit in the second mode.

20. The method of clause 19, wherein the circuit further comprises a resistor connected in parallel with the capacitor between the first input terminal and the output terminal.

21. The method of clause 20, wherein the circuit further comprises a switch connected in series with the resistor between the first input terminal and the output terminal, and wherein the switch is configured to be open when the operation mode is the first mode.

22. The method of clause 20 or clause 21, further comprising determining a resistance value of the resistor to obtain a target gain of the circuit when the operation mode is the second mode.

23. The method of clause 22, further comprising:

adjusting the resistance value of the resistor based on the determined resistance value to cause the circuit to operate in the second mode.

24. The method of any one of clauses 19-23, wherein the output of the sensor layer represents an output of the one sensing element in the first mode, and wherein the output of the sensor layer represents an output of the set of multiple sensing elements in the second mode.

25. The method of any one of clauses 19-24, wherein determining the capacitance value of the capacitor comprises:

determining the capacitance value of the capacitor based on an output signal of the circuit generated by providing a test current to the first input terminal, wherein the output signal is indicative of a bandwidth of the circuit.

26. The method of clause 25, wherein determining the capacitance value of the capacitor comprises:

determining the capacitance value of the capacitor based on a decay shape of the output signal of the circuit in response to stopping providing the test current, wherein the decay shape of the output signal is indicative of the bandwidth of the circuit.

27. The method of clause 25, wherein determining the capacitance value of the capacitor comprises:

determining the capacitance value of the capacitor based on a growth shape of the output signal of the circuit in response to providing the test current, wherein the growth shape of the output signal is indicative of the bandwidth of the circuit.

28. The method of any one of clauses 19-27, wherein the amplifier is configured to operate as a charge transfer amplifier in the first mode and as a transimpedance amplifier in the second mode.

29. The method of any one of clauses 19-28, wherein causing the circuit to operate in the acquired operation mode includes adjusting the capacitance value of the capacitor based on the determined capacitance value.

30. A non-transitory computer readable medium that stores a set of instructions that are executable by at least one processor of a system to cause the system to perform a method for operating a circuit for a charged particle detector, the method comprising:

acquiring an operation mode of the circuit, the operation mode comprising a first mode and the second mode, wherein the circuit comprises:

an amplifier configured to receive a signal representing an output of a sensor layer and having a first input terminal and an output terminal, and
a capacitor connected between the first input terminal and the output terminal;
determining a set of one or more sensing elements in the sensor layer to be connected to the circuit according to the acquired operation mode, wherein one sensing element is coupled to the circuit in the first mode and a set of multiple sensing elements are coupled to the circuit in the second mode;
determining, according to the acquired operation mode, a capacitance value of the capacitor based on the determined set of one or more sensing elements; and
causing the circuit to operate in the acquired operation mode based on the determined capacitance value of the capacitor,
wherein the capacitance value of the capacitor is determined to obtain a target gain of the circuit in the first mode and to obtain a target bandwidth of the circuit in the second mode.

31. The computer readable medium of clause 30, wherein the circuit further comprises a resistor connected in parallel with the capacitor between the first input terminal and the output terminal.

32. The computer readable medium of clause 31, wherein the circuit further comprises a switch connected in series with the resistor between the first input terminal and the output terminal, and
wherein the switch is configured to be open when the operation mode is the first mode.

33. The computer readable medium of clause 31 or clause 32, wherein the set of instructions that are executable by at least one processor of the system cause the system to further perform:
determining a resistance value of the resistor to obtain a target gain of the circuit when the operation mode is the second mode.

34. The computer readable medium of clause 33, wherein the set of instructions that are executable by at least one processor of the system cause the system to further perform:
adjusting the resistance value of the resistor based on the determined resistance value to cause the circuit to operate in the second mode.

35. The computer readable medium of any one of clauses 30-34, wherein the output of the sensor layer represents an output of the one sensing element in the first mode, and
wherein the output of the sensor layer represents an output of the set of multiple sensing elements in the second mode.

36. The computer readable medium of any one of clauses 30-35, wherein, in determining the capacitance value of the capacitor, the set of instructions that are executable by at least one processor of the system cause the system to further perform:
determining the capacitance value of the capacitor based on an output signal of the circuit generated by providing a test current to the first input terminal, wherein the output signal is indicative of a bandwidth of the circuit.

37. The computer readable medium of clause 36, wherein, in determining the capacitance value of the capacitor, the set of instructions that are executable by at least one processor of the system cause the system to further perform:

determining the capacitance value of the capacitor based on a decay shape of the output signal of the circuit in response to stopping providing the test current, wherein the decay shape of the output signal is indicative of the bandwidth of the circuit.

38. The computer readable medium of clause 36, wherein, in determining the capacitance value of the capacitor, the set of instructions that are executable by at least one processor of the system cause the system to further perform:
determining the capacitance value of the capacitor based on a growth shape of the output signal of the circuit in response to providing the test current, wherein the growth shape of the output signal is indicative of the bandwidth of the circuit.

39. The computer readable medium of any one of clauses 30-38, wherein the amplifier is configured to operate as a charge transfer amplifier in the first mode and as a transimpedance amplifier in the second mode.

40. The computer readable medium of any one of clauses 30-39, wherein, in causing the circuit to operate in the acquired operation mode, the set of instructions that are executable by at least one processor of the system cause the system to further perform:
adjusting the capacitance value of the capacitor based on the determined capacitance value.

41. A circuit for a charged particle detector comprising:
a first channel comprising:
a first amplifier configured to receive a first signal representing a first output of a first set of sensing elements and comprising a first input terminal and a first output terminal;
a first capacitor connected between the first input terminal and the first output terminal; and
a first resistor connected in parallel with the first capacitor between the first input terminal and the first output terminal, and
a second channel comprising:
a second amplifier configured to receive a second signal representing a second output of a second set of sensing elements and comprising a second input terminal and a second output terminal;
a second capacitor connected between the second input terminal and the second output terminal; and
a second resistor connected in parallel with the second capacitor between the second input terminal and the second output terminal,
wherein the first channel and the second channel are configured to be controlled to have an equal gain by adjusting a capacitance value of either of the first capacitor or the second capacitor.

42. The circuit of clause 41, wherein the first resistor is adjustable using a resistance value of the resistor to control of a gain of the first channel.

43. The circuit of clause 41 or clause 42, wherein an adjusted capacitance value of the first capacitor is different from an adjusted capacitance value of the second capacitor.

Block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, a charged particle inspection system may be but one example of a charged particle beam system consistent with embodiments of the present disclosure.

The invention claimed is:

1. A circuit for a charged particle detector comprising:
an amplifier configured to receive a signal representing an output of a sensor layer and comprising a first input terminal and an output terminal;
a capacitor connected between the first input terminal and the output terminal; and
a resistor connected in parallel with the capacitor between the first input terminal and the output terminal;
wherein the circuit is configured to operate in a first mode and a second mode, and
wherein the capacitor is adjustable using a capacitance value of the capacitor to enable control of a gain of the circuit operating in the first mode and control of a bandwidth of the circuit operating in the second mode.

2. The circuit of claim 1, further comprising a switch connected in series with the resistor between the first input terminal and the output terminal,
wherein the switch is open in the first mode.

3. The circuit of claim 1, wherein the resistor is adjustable using a resistance value of the resistor to enable control of a gain of the circuit operating in the second mode.

4. The circuit of claim 1, wherein when the circuit operates in the first mode, the output of the sensor layer represents an output of one sensing element in the sensor layer,
and when the circuit operates in the second mode, the output of the sensor layer represents an output of multiple sensing elements in the sensor layer.

5. The circuit of claim 1, further comprising:
a tester configured to provide a test current to the first input terminal, wherein the test current enables the circuit to generate an output signal indicative of a bandwidth of the circuit.

6. The circuit of claim 5, wherein the tester is configured to stop providing the test current, which enables the circuit to generate the output signal having a decay shape indicative of the bandwidth of the circuit.

7. The circuit of claim 5, wherein the test current enables the circuit to generate the output signal having a growth shape indicative of the bandwidth of the circuit.

8. The circuit of claim 1, further comprising:
an offset trimmer configured to provide a compensation current to the first input terminal to enable compensating an output signal offset of the amplifier.

9. The circuit of claim 1, wherein the amplifier is configured to operate as a charge transfer amplifier in the first mode and as a transimpedance amplifier in the second mode.

10. A charged particle detector comprising:
a sensor layer comprising a plurality of sensing elements; and
a circuit comprising:
an amplifier configured to receive a signal representing an output of the sensor layer and comprising a first input terminal and an output terminal;
a capacitor connected between the first input terminal and the output terminal; and
a resistor connected in parallel with the capacitor between the first input terminal and the output terminal,
wherein the circuit is configured to operate in a first mode and a second mode, and
wherein the capacitor is adjustable using a capacitance value of the capacitor to enable control of a gain of the circuit operating in the first mode and control of a bandwidth of the circuit operating in the second mode.

11. The detector of claim 10, wherein the circuit further comprises:
a switch connected in series with the resistor between the first input terminal and the output terminal,
wherein the switch is open in the first mode.

12. The detector of claim 10, wherein the resistor is adjustable using a resistance value of the resistor to enable control of a gain of the circuit operating in the second mode.

13. The detector of claim 10, wherein when the circuit operates in the first mode, the output of the sensor layer represents an output of one sensing element in the sensor layer,
and when the circuit operates in the second mode, the output of the sensor layer represents an output of multiple sensing elements in the sensor layer.

14. The detector of claim 10, wherein the circuit further comprises:
a tester configured to provide a test current to the first input terminal, wherein the test current enables the circuit to generate an output signal indicative of a bandwidth of the circuit.

15. The detector of claim 14, wherein the tester is configured to stop providing the test current, which enables the circuit to generate the output signal having a decay shape indicative of the bandwidth of the circuit.

* * * * *